United States Patent
Tsai et al.

[19]

[11] Patent Number: 6,161,753
[45] Date of Patent: Dec. 19, 2000

[54] METHOD OF MAKING A LOW-PROFILE WIRE CONNECTION FOR STACKED DIES

[75] Inventors: Yu-Fang Tsai; Sung-Fei Wang; Su Tao; Meng-Hui Lin, all of Kaohsiung, Taiwan

[73] Assignee: Advanced Semiconductor Engineering, Inc., Kaohsiung, Taiwan

[21] Appl. No.: 09/431,217

[22] Filed: Nov. 1, 1999

[51] Int. Cl.[7] .............................. B23K 1/05; B23K 20/10; B23K 20/12; B23K 31/02

[52] U.S. Cl. .................................. 228/180.5; 228/110.1; 438/109; 257/784

[58] Field of Search ..................... 228/4.5, 110.1, 228/180.5, 123.1; 438/51, 55, 64, 109; 257/777, 784, 686; 219/56.1, 56.21, 56.22

[56] References Cited

U.S. PATENT DOCUMENTS

| | | | |
|---|---|---|---|
| 5,111,989 | 5/1992 | Holdgrafer et al. | 228/110 |
| 5,156,323 | 10/1992 | Kumazawa et al. . | |
| 5,291,061 | 3/1994 | Ball | 257/777 |
| 5,917,242 | 6/1999 | Ball | 257/737 |
| 5,961,029 | 10/1999 | Nishiura et al. | 228/180.5 |
| 5,967,401 | 10/1999 | Nishiura et al. | 228/180.5 |
| 5,989,995 | 11/1999 | Nishiura et al. | 438/617 |

*Primary Examiner*—Patrick Ryan
*Assistant Examiner*—Colleen Cooke
*Attorney, Agent, or Firm*—Bacon & Thomas, PLLC

[57] ABSTRACT

A stacked dies include a substrate, a lower chip and an upper chip. A plurality of upper wires have the bent portion at the bonding pad of the substrate to reduce the height and increase the strength of the wire so as to increase the reliability of the product and to increase the space between the lower wire and the upper wire for reduction cross talk. A method of making low profile upper wire connection comprising steps of: after an upper wire is connected to a first bonding point, a capillary is moved straight up a first distance, and then the capilairy is moved away from a second bonding point thus making a first reverse action to bend the wire in an appropriate angle so as to form the first bent point. The capillary is again raised a second distance and moved downward a second reverse action to bend the upper wire by an appropriate angle so as to form the second bent point. The capillary is raised a third distance and then the capillary is moved away the second bonding point thus making an action to bend the wire in an appropriate angle so as to form the third bent point. The capillary is further raised a fourth distance. The capillary is raised to the second bonding point to extend the length of two wire ends which is enough to make a wire loop, amd then the capillary is moved down to the second bonding point where the bonding is performed.

4 Claims, 7 Drawing Sheets

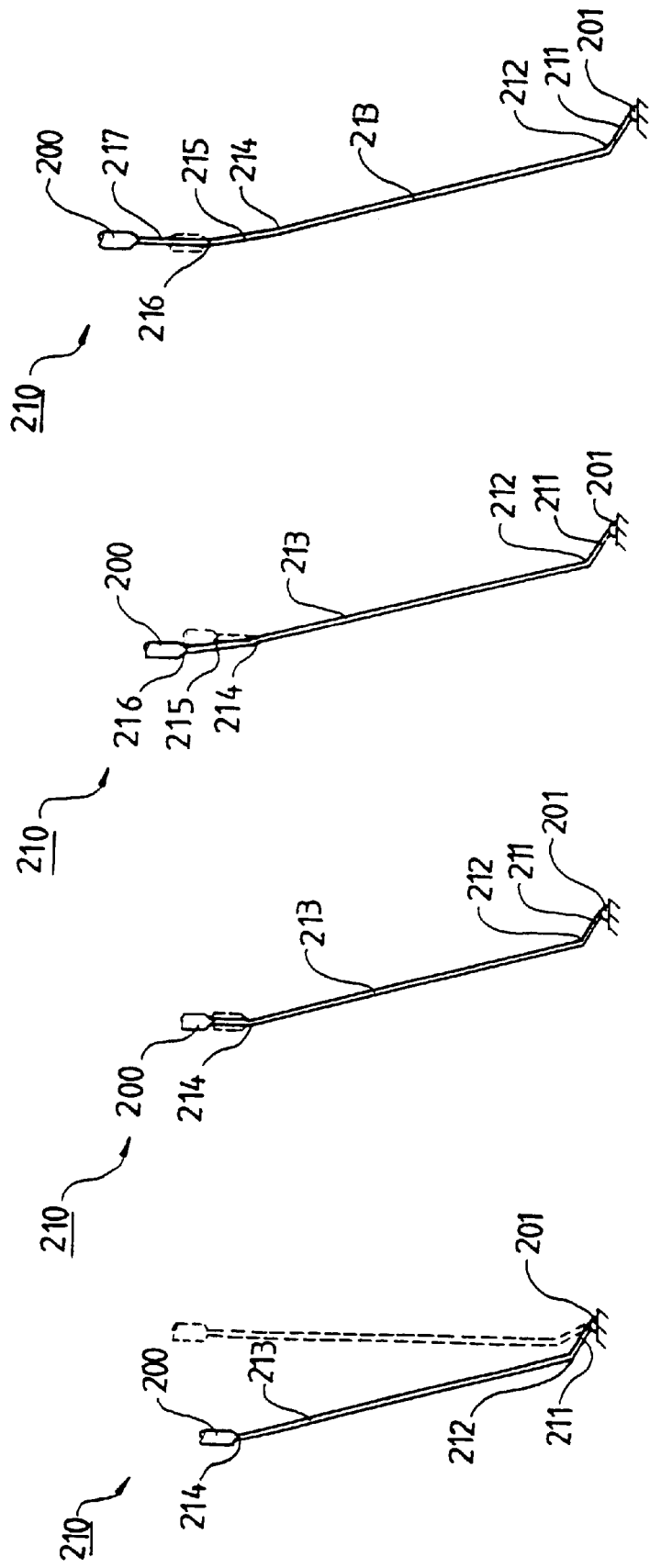

METHOD OF MAKING A LOW-PROFILE WIRE CONNECTION FOR STACKED DIES

BACKGROUND OF THE INVENTION

1. Field of the Invention

The present invention is related to a method of making a low-profile wire connection for stacked dies and more particularly to the method of wire connection for an upper die arranged with two wires bent around a second bonding pad.

2. Description of the Related Art

The conventional method of making a wire connection includes a wire electrically connecting a first bonding pad and a second bonding pad to form a closed loop in a semiconductor device. The wire extends upward from the first bonding pad and downward to the second bonding pad, so that the wire has a high profile between the first bonding pad and the second bonding pad. Because the high profile is mechanically supported only at the point of the bonding pad, the high profile can easily be shifted by stress. When the semiconductor device is in the molding process, the liquified encapsulant material pushes the wires, which can easily be shifted, and then wire sweeping occurs. To overcome the above-mentioned wire sweep problem, the wire is bent to decrease the height of the wire and to increase the strength of structure.

U.S. Pat. No. 5,156,323, issued on Oct. 20, 1992 to Kumazawa et al., discloses a wire bonding method. As shown in FIG. 1, a capillary 100 mechanically bonds wire 110 to the first bonding pad 101 and is moved upward a first distance 111. As shown in FIG. 2, the capillary 100 is then moved away from the second bonding pad to form a first bent portion 112 thus making the first reverse action to bend the wire 110 at en appropriate angle. As shown in FIG. 3, the capillary 100 is again raised an appropriate length to form a second distance 113. As shown in FIG. 4, wire 110 is bent at an appropriate angle to form a second bent portion 114, so that the capillary 100 is moved away from the second bonding pad. As shown in FIG. 5, the capillary 100 is further raised and then aimed toward the second bonding pad through a third distance 115 by feeding out the wire 110 to a length which is sufficient to make a wire loop. As shown in FIG. 6, the capillary 100 is moved down to the second bonding pad 102 according to the trace where bonding is performed. The wire 110 has the first bent portion 112 and the second bent portion 114 which reduce the height of wire and increase its strength.

Although the wire bonding method of U.S. Pat. No. 5,156,323 has the first bent portion and the second portion to reduce the height and increase the strength of the wire, this wire bonding method cannot be adapted for use in a stacked dies structure. if the stacked dies stucture uses this wire bonding method, the wire of the lower die and the wire of the upper die are in too close proximity on the second bonding pad causing cross talk. Additionally, the length of the upper wire renders it too long and weak, and it is shifted by the encapsulant material causing it to touch the other wire during compound molding.

The present invention intends to provide a wire bonding method which has a bent portion of upper wire at the second bonding point to reduce the height and increase the strength of the wire in such a way as to mitigate and overcome the above problem.

SUMMARY OF THE INVENTION

The primary objective of this invention is to provide a method of making a low-profile wire connection for stacked dies, which have a bent portion of upper wire at the second bonding point to reduce the height and increase the strength of the wire so as to increase the reliability of the product.

The secondary objective of this invention is to provide a method of making a low-profile wire connection for stacked dies, which have a bent portion of upper wire at the second bonding point to increase the space between the lower wire and the upper wire for reduction of cross talk.

The present invention is a low-profile wire connection for stacked dies. The stacked dies include a substrate, a lower chip and an upper chip. The lower chip is adhesively attached to the substrate and has a plurality of bonding pads which are electrically connected to the corresponding bonding pads of the substrate by first wires. One end of the first wire connects to the bonding pad of the lower chip, and the other end connects to the corresponding bonding pads of the substrate. The upper chip is adhesively attached to the lower chip and has a plurality of bonding pads which are electrically connected to the corresponding bonding pads of the substrate by second wires. One end of the second wire connects to the bonding pad of the upper chip and, the other end connects to the corresponding bonding pads of the substrate. The second wire has a bent portion at the bonding pad of the substrate to reduce the height and increase the strength of the wire so as to increase the reliability of the product and to increase the space between the first wire and the second wire for reduction cross talk.

The present invention is a method of making a low-profile wire connection. After an upper wire is connected to a first bonding point a capillary is moved straight up a first distance, and then the capillary is moved away from a second bonding point thus making the first reverse action to bend the wire in an appropriate angle so as to form the first bent point. The capillary is raised a second distance and moved downward in a second reverse action to bend the upper wire by an appropriate angle so as to form the second in bent point. The capillary is raised a third distance, and then the capillary is moved away from the second bonding point thus bending the wire in an appropriate angle so as to form the third bent point. The capillary is further raised a fourth distance. The capillary is raised to the second bonding point to extend the length of two wire ends enough to make a wire loop, and then the capillary is moved down to the second bonding point where the bonding is performed.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein;

FIGS. 8a–8i are side views of the steps of upper wire bonding in accordance with the present invention.

DETAILED DESCRIPTION OF THE INVENTION

Stacked dies with a low-profile wire connection, in accordance with the present invention, mainly comprise a substrate, an upper chip and a lower chip; a plurality of first (lower) wires which have one end connecting to the bonding pads of the lower chip and the other end connecting to a bonding pad of the substrate. A plurality of second (upper) wires have one end connecting to a bonding pad of the upper chip and the other end connecting to a bonding pad of the substrate. Each second wire has two bent portions at the substrate to reduce the height of wire and the possibility of wire sweep and to increase the strength of the wire so as to increase the reliability of the product. Additionally, the second wire has two bent portions at the substrate to increase the space between the first wire and the second wire for cross talk reduction.

Figure 1:
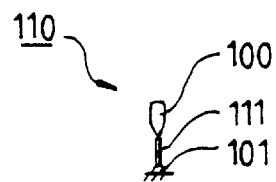
FIG. 1 is a side view of the first step of wire bonding in accordlance with U.S. Pat. No. 5,156,323.
Figure 2:
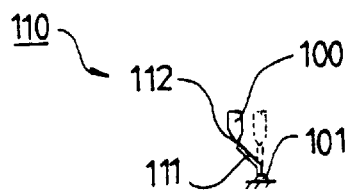
FIG. 2 is a side view of the second step of wire bonding in accordance with U.S. Pat. No. 5,156,323.
Figure 3:
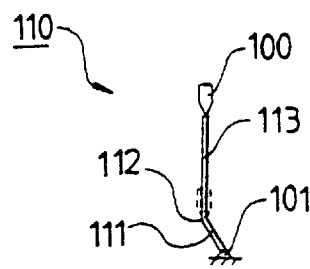
FIG. 3 is a side view of the third step of wire bonding in accordance with U.S. Pat. No. 5,156,323.
Figure 4:
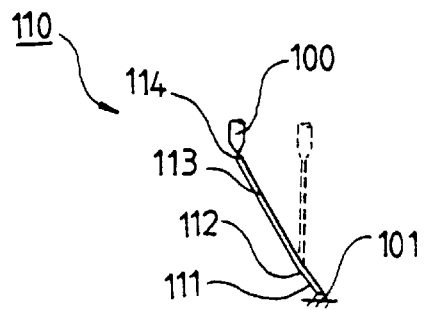
FIG. 4 is a side view of the fourth step of wire bonding in accordance with U.S. Pat. No. 5,156,323.
Figure 5:
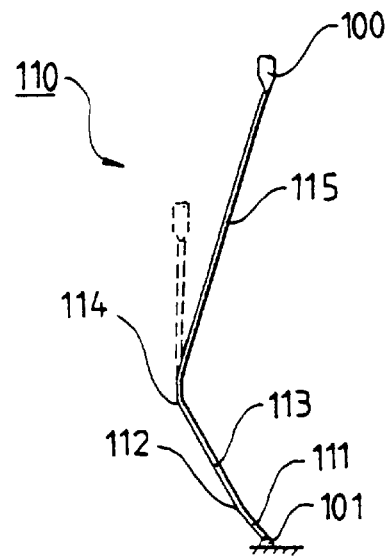
FIG. 5 is a side view of the fifth step of wire bonding in accordance with U.S. Pat. 5,156,323.
Figure 6:
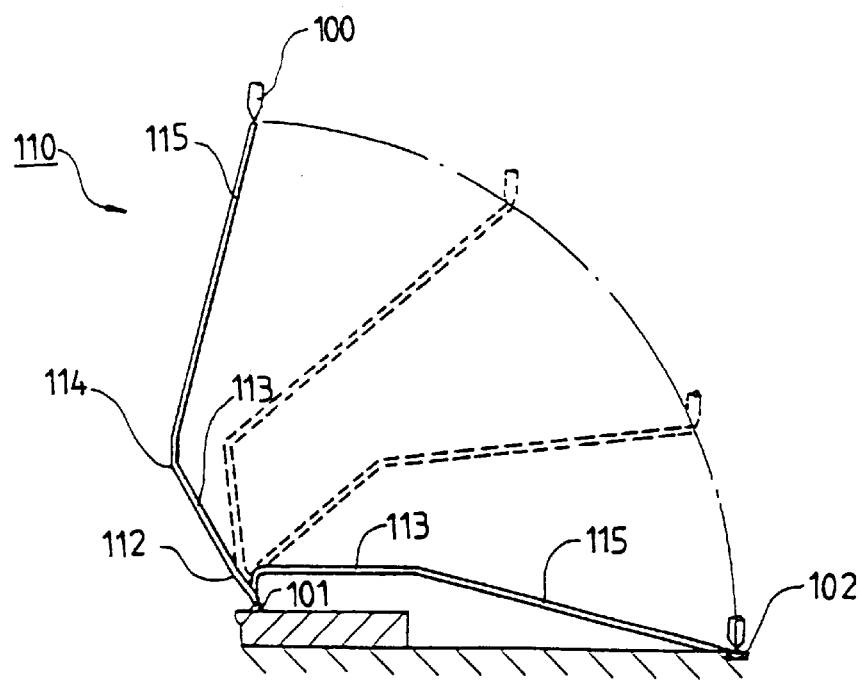
FIG. 6 is a side view of the fist step of wire bonding in accordance with the present invention.
Figure 7A:
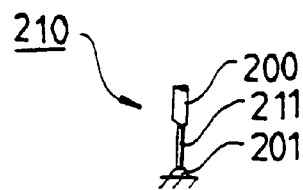
FIGS. 7a–7g are side views of the steps of lower wire bonding in accordance with the present invention.

The present invention provides a method of wire bonding for the lower wire so that the lower wire does not touch the edge of the lower chip. The lower wire leaps over the edge of the lower chip and then descends to the bonding point. Referring to FIG. 7a, the method of making a low-profile wire connection for stacked dies in accordance with the present invention includes the capillary 200 connecting the lower wire 210 to a first bonding point 201 and the capillary 200 moving upward a first distance 211.

Figure 7B:
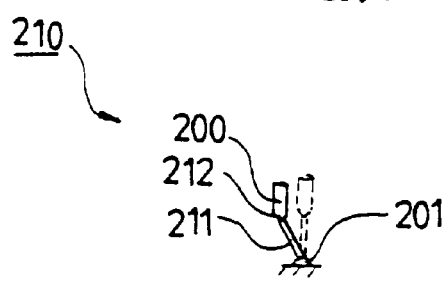

Referring to FIG. 7b, then the capillary 200 is moved away from the second bonding point thus making a first reverse action to bend the lower wire 210 in an appropriate angle so as to form a first bent point 212 such that the lower wire 210 will be deformed at the first bent point 212 when it is pulled.

Figure 7C:
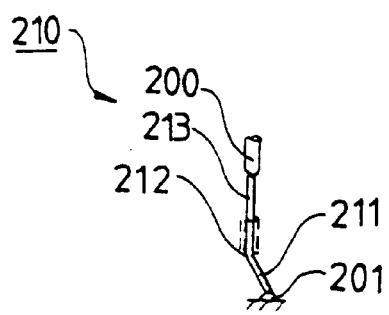

Referring to FIG. 7c, the capillary 200 is raised a second distance 213. Therefore, the lower wire 210 now comprises the first distance 211, the first bent point 212 and the second distance 213.

Figure 7D:
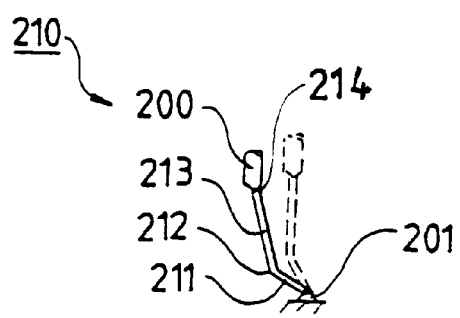

Referring to FIG. 7d, the capillary 200 is moved downward and opposite to the second bonding point to form a second bent point 214 such that the lower wire 210 will be deformed at the second bent point 214 when it is pulled.

Figure 7E:
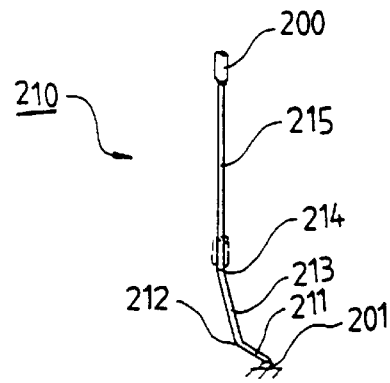

Referring to FIG. 7e, the capillary 200 is raised again to form a fourth distance 215. Therefore, the lower wire 210 now comprises the first distance 211, the first bent point 212, the second distance 213, the second bent point 214 and the third distance 215.

Figure 7F:
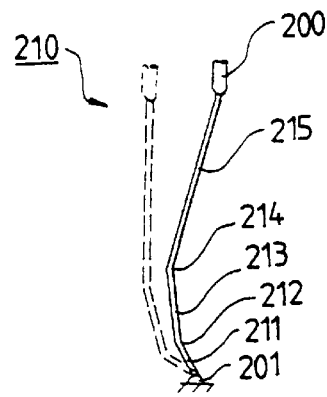

Referring to FIG. 7f, the capillary 200 is raised again to the second bonding point to pull the lower wire 210 to a predetermined length which is an amount sufficient for connecting wire 210 to the second bonding point.

Figure 7G:
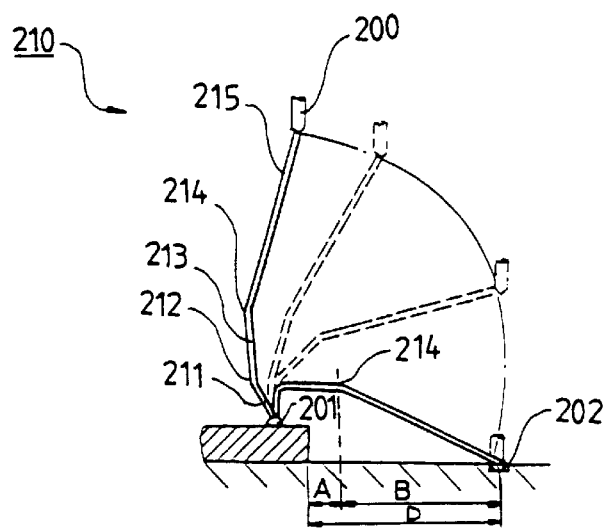

Referring to FIG. 7g, the capillary 200 is moved to the second bonding point 202 along traces. Then lower wire 210 connects the first bonding point 201 to the second bonding point 202. Thus the second bent point 214 of the lower wire 210 is a sufficient distance from the edge of the lower chip, and the third distance 215 gives lower wire 210 a lower height. The second distance 213 of the present invention is preferably held horizontal. The horizontal distance A between the first bonding point 201 and the second bent point 214 is preferably 30–40% of the horizontal distance B between the first bonding point 201 and the second bonding point 202. The horizontal distance B between the second bent point 214 and the second bonding point 202 is preferable 60–70% of the horizontal distance B between the first bonding point 201 and the second bonding point 202.

Figure 8A:
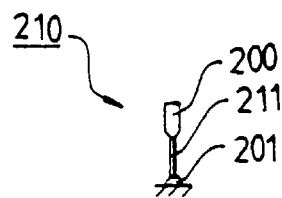

The present invention provides a method of making low-profile wire connection that reduces the height of the upper wire, increases the strength of the upper wire whose horizontal length is too great and increases the space between the lower wire and the upper wire to reduce cross talk. In the present invention, the upper wire has two bent portions at the second bonding point so that the long structure of the upper wire is stronger and it is far enough from the lower wire. Referring to FIG. 8a, the method of making a low-profile wire connection for stacked dies in accordance with the present invention includes a capillary 200 connecting an upper wire 210 to a first bonding point 201 and the capillary 200 moving upward a first distance 211.

Figure 8B:
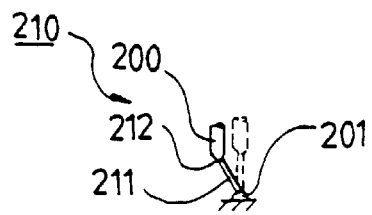

Referring to FIG. 8b, the capillary 200 is then moved away from the second bonding point thus making a first reverse action to bend the upper wire 210 in an appropriate angle so as to form a first bent point 212 such that the upper wire 210 will be deformed at the first bent point 212 when it is pulled.

Figure 8C:
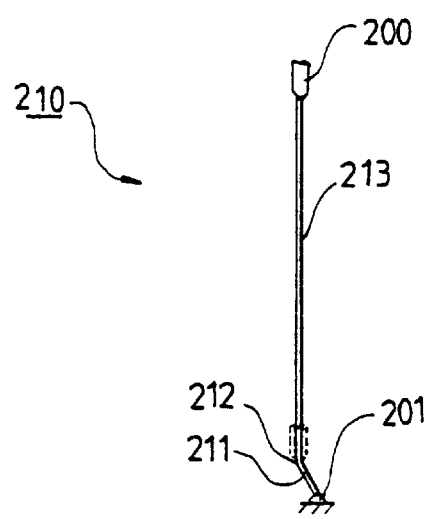

Referring to FIG. 8c, the capillary 200 is raised a second distance 213. Thus, the upper wire 210 now comprises the first distance 211, the first bent point 212 and the second distance 213.

Referring to FIG. 8d, the capillary 200 is moved downward and opposite to the second bonding point to form a second bent point 214 such that the upper wire 210 will be deformed at the second bent point 214 when it is pulled.

Referring to FIGS. 8e and 8f, the capillary 200 is raised again and moved opposite to the second bonding point to form a third distance 215 and a third bent point 216. Now, the upper wire 210 comprises the first distance 211, the first bent point 212, the second distance 213, the second bent point 214, the third distance 215 and the third bent point 216.

Referring to FIG. 8g, the capillary 200 is raised again to form a fourth distance 217. Now, the upper wire 210 comprises the first distance 211, the first bent point 212, the second distance 213, the second bent point 214, the third distance 215, the third bent point 216 and the fourth distance 217.

Figure 8I:
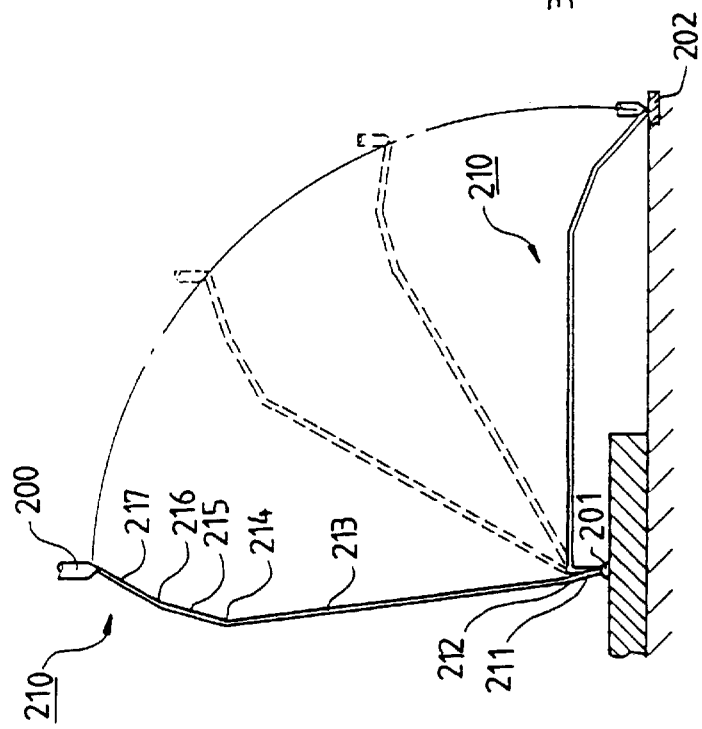
Figure 8H:
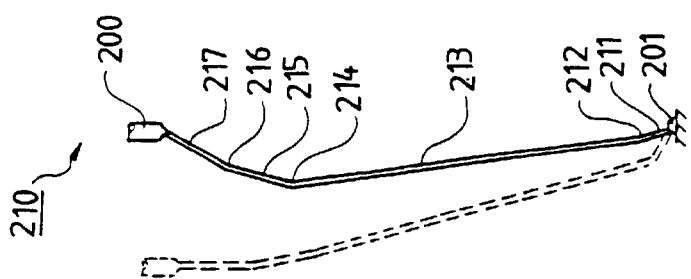

Referring to FIG. 8h, the capillary 200 is raised again to the second bonding point to pull upper wire 210 to a predetermined length in an amount sufficient for connecting wire 210 to the second bonding point.

Referring to FIG. 8i, the capillary 200 is moved to the second bonding point 202 along traces. The upper wire 210 is connected to the first bonding point 201 and to the second bonding point 202. The second bent point 214 and the third bent point 216 of the lower wire 210 increase the strength of upper wire 210 as well as the distance from the lower wire. The third distance 215 and the fourth distance 217 of the present invention are preferably equal and thus equidistant from so as to appear the same torque of the third distance 215 and the fourth distance 217 at the third bent point 216. The second distance 213 of the present invention is preferable held horizontal.

According to the method of the present invention, therefore, the wire loop 210 includes a neck height portion 211, a trapezoidal length portion 213, a first inclined portion 215, and a second inclined portion 217 along with two bent points 212 and 214 formed at both ends of the trapezoidal length portion. Preferably, the third bent point 216 is further formed between the first inclined portion 215 and the second inclined portion 217 in such a manner that the inclined portions 215 and 217 are bent outwardly from the substrate. Since the third bent point 216 is formed in the inclined portions 215 and 217 of the wire loop 210 so that the inclined portions 215 and 217 have an outwardly bent shape with respect to the substrate, the third ben point 216 reinforces the strength of the wire loop 210 at the inclined portions 215 and 217.

Figure 9:
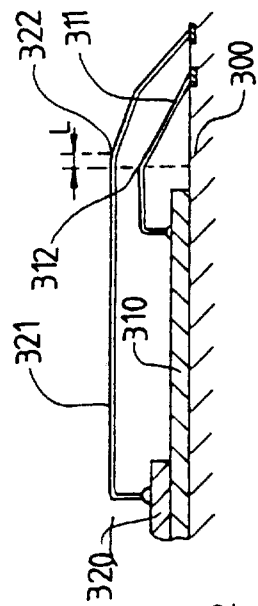
FIG. 9 is a side view of the wire connection for stacked dies in accordance with the present invention.

FIG. 9 illustrates the method of making a low-profile wire connection, in accordance whth the present invention, as applied to stacked dies. The stacked dies comprise a substrate 300, a first chip 310 and a second chip 320. The first chip 310 is attached to the substrate 300, and the second chip 320 is attached to the first chip 310. A plurality of first wires 311 electrically connect the first chip 310 to the substrate 300. A plurality of second wires 321 electrically connect the second chip 320 to the substrate 300. The middle poition of the first wire 311 of the present invention is preferably parallel to the middle portion of the second wire 321. Because the second wire 321 of the present invention uses the method of making a low-profile wire connection for stacked dies, since the inclined portions of the wire loop 321 have an outward bent point 323, the distance between the inclined portions of the wire loop 321 and the inclined portions 332 of the wire loop 311 is significantly increased so as to reduce the cross talk therebetween. The horizontal distance L between the bent point 312 of the first wire 311 and the bent point 322 of the second wire 321 is preferably in the range of ±5 mil to 10 mil.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A method of making a low profile wire connection in which a first bonding point and a second bonding point are connected by a wire that passes through a capillary, comprising the steps of:

connecting said wire to said first bonding point;

raising said capillary to deliver said wire from said capillary a first distance;

moving said capillary in a direction away from said second bonding point to bend said wire and form a first bent point;

raising said capillary to deliver said wire from said capillary a second distance;

moving said capillary in a direction away from said second bonding point to bend said wire and form a second bent point;

raising said capillary to deliver said wire from said capillary a third distance;

moving said capillary in a direction away from said second bonding point to bend said wire and form a third bent point;

raising said capillary to deliver said wire from said capillary a fourth distance;

moving said capillary toward the second bonding point without moving said wire; and connecting said wire to the second bonding point, wherein said wire forms a substantially trapezoidal wire loop connecting said first bonding point and said second bonding point, and wherein said wire loop includes a neck height portion, a trapezoidal length portion, and an inclined portion, and wherein said third bent point is bent outwardly at said inclined portion of said wire loop, thereby enhancing a strength of said wire loop.

2. A method of making a low profile wire connection as claimed in claim 1, wherein said second distance between said first bent point and said second bent point is approximately 30% to 40% of the length between said first bonding point and said second bonding point.

3. A method of making a low profile wire connection as claimed in claim 1, wherein said third distance is equal to said fourth distance.

4. A wire bonding method for a stacked multichip device comprising a substrate, a first chip attached to the substrate, and a second chip attached to the first chip, comprising the steps of:

connecting a first wire to a first bonding point on said first chip;

raising said capillary to deliver said first wire from said capillary a first distance;

moving said capillary in a direction away from a second bonding point on said substrate to bend said first wire and form a first bent point;

raising said capillary to deliver said first wire from said capillary a second distance;

moving said capillary in a direction away from said second bonding point to bend said first wire and form a second bent point;

raising said capillary to deliver said first wire from said capillary a third distance;

moving said capillary in a direction toward said second bonding point on said substrate and then connecting said first wire to said second bonding point;

connecting a second wire to a third bonding point on said second chip;

raising said capillary to deliver said second wire from said capillary a fourth distance;

moving said capillary in a direction away from a fourth bonding point on said substrate to bend said second wire and form a third bent point;

raising said capillary to deliver said second wire from said capillary a fifth distance;

moving said capillary in a direction away from said fourth bonding point to bend said second wire and form a fourth bent point;

raising said capillary to deliver said second wire from said capillary a sixth distance;

moving said capillary in a direction away from said fourth bonding point to bend said second wire and form a fifth bent point;

raising said capillary to deliver said second wire from said capillary a seventh distance;

moving said capillary toward the fourth bonding point without moving said second wire; and connecting said second wire to the fourth bonding point, wherein said second wire forms a substantially trapezoidal wire loop, wherein said wire loop includes a neck height portion, a trapezoidal length portion, and an inclined portion, and wherein said fifth bent point is bent outwardly at said inclined portion of said wire loop, thereby enhancing a strength of said wire loop and increasing a distance between said first wire and said second wire to reduce cross talk between said first wire and said second wire.

* * * * *